US009433074B2

(12) United States Patent
Dede et al.

(10) Patent No.: US 9,433,074 B2
(45) Date of Patent: Aug. 30, 2016

(54) PRINTED WIRING BOARDS HAVING THERMAL MANAGEMENT FEATURES AND THERMAL MANAGEMENT APPARATUSES COMPRISING THE SAME

(71) Applicant: Toyota Motor Engineering & Manufacturing North America, Inc., Erlanger, KY (US)

(72) Inventors: Ercan Mehmet Dede, Ann Arbor, MI (US); Tsuyoshi Nomura, Ann Arbor, MI (US); Paul Schmalenberg, Ann Arbor, MI (US); Jae Seung Lee, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 315 days.

(21) Appl. No.: 14/038,834

(22) Filed: Sep. 27, 2013

(65) Prior Publication Data

US 2014/0318829 A1 Oct. 30, 2014

Related U.S. Application Data

(60) Provisional application No. 61/816,917, filed on Apr. 29, 2013.

(51) Int. Cl.
*H05K 1/00* (2006.01)
*H05K 1/02* (2006.01)

(52) U.S. Cl.
CPC .......... *H05K 1/0203* (2013.01); *H05K 1/0209* (2013.01); *H05K 2201/0376* (2013.01); *H05K 2201/09718* (2013.01); *H05K 2201/09972* (2013.01); *H05K 2201/10553* (2013.01)

(58) Field of Classification Search
None
See application file for complete search history.

(56) References Cited

U.S. PATENT DOCUMENTS

| | | | | |
|---|---|---|---|---|
| 5,268,812 A | * | 12/1993 | Conte | F28D 15/0233 165/104.33 |
| 5,937,936 A | * | 8/1999 | Furukawa | F28D 15/0233 165/104.26 |
| 6,225,571 B1 | * | 5/2001 | Bream | H01L 23/36 165/185 |
| 6,257,329 B1 | * | 7/2001 | Balzano | H05K 1/0204 165/185 |
| 6,380,633 B1 | * | 4/2002 | Tsai | H01L 23/49838 257/690 |
| 6,901,994 B1 | * | 6/2005 | Jin-Cherng | F28D 15/046 165/104.26 |
| 6,957,692 B1 | * | 10/2005 | Win-Haw | F28D 15/0233 165/104.21 |

(Continued)

OTHER PUBLICATIONS

U.S. Appl. No. 14/038,837, filed Sep. 27, 2013.

(Continued)

*Primary Examiner* — Steven T Sawyer
(74) *Attorney, Agent, or Firm* — Dinsmore & Shohl LLP (57) ABSTRACT

A printed wiring board includes an insulator substrate, an electrical conductor at least partially embedded in the insulator substrate, and a thermal conductor at least partially embedded in the insulator substrate. The printed wiring board also includes a temperature-insensitive component mounting region and a temperature-sensitive component mounting region. The insulator substrate and the thermal conductor are arranged into a targeted heat transfer region proximate to the temperature-sensitive component mounting region and a bulk region at positions spaced apart from the temperature-sensitive component mounting region.

16 Claims, 7 Drawing Sheets

(56) References Cited

U.S. PATENT DOCUMENTS

| | | | |
|---|---|---|---|
| 7,308,008 | B2 | 12/2007 | Freeman et al. |
| 9,125,299 | B2* | 9/2015 | Wittenberg .......... H05K 1/0203 |
| 2004/0071035 | A1* | 4/2004 | Poechmueller ........ G11C 5/005 365/222 |
| 2006/0144565 | A1* | 7/2006 | Tsai .................... F28D 15/0233 165/104.26 |
| 2007/0045804 | A1* | 3/2007 | Lin ....................... H01L 23/367 257/686 |
| 2007/0108595 | A1 | 5/2007 | Refai-Ahmed |
| 2009/0166003 | A1* | 7/2009 | Lai ..................... F28D 15/0233 165/104.26 |
| 2009/0180254 | A1* | 7/2009 | McGough ................. G06F 1/20 361/697 |
| 2011/0222246 | A1 | 9/2011 | Hsieh et al. |
| 2012/0147565 | A1 | 6/2012 | I et al. |
| 2012/0329183 | A1* | 12/2012 | Wang ................... H05K 1/0204 438/26 |
| 2014/0092560 | A1* | 4/2014 | Gibbs .................. H05K 1/0209 361/705 |
| 2014/0167618 | A1* | 6/2014 | Wang ................. H05B 33/0803 315/152 |
| 2014/0311713 | A1* | 10/2014 | Wu ...................... H05K 1/0209 165/104.32 |

OTHER PUBLICATIONS

Guenneau, et al., Fick's Second Law Transformed: One Path to Cloaking in Mass Diffusion, Journal of the Royal Society Interface, Mar. 27, 2013.

Xu, et al., Experimental Demonstration of an Ultra-Thin Three-Dimensional Cloak, Pre-publication arxiv.org, Jun. 27, 2013.

Dede, et al., Thermal-Composite Design Optimization for Heat Flux Shielding, Focusing, and Reversal, Structural and Multidisciplinary Optimization, Jul. 4, 2013.

Han, et al., Bilayer Isotropic Thermal Cloak, Pre-publication arxiv. org, Jul. 8, 2013.

Dede, et al., Heat Flux Cloaking, Focusing, and Reversal in Ultra-Thin Composites Considering Conduction-Convection Effects, Applied Physics Letters, Aug. 8, 2013.

Dede, Simulation and optimization of heat flow via anisotropic material thermal conductivity, Computational Materials Science, 50 (2010) pp. 510-515.

Narayana et al., Heat flux manipulation with engineered thermal materials, Physical Review Letters, 108 (2012) 214303.

Zain-Ul-Abdein et al., Computational investigation of factors affecting thermal conductivity in a particulate filled composite using finite element method, International Journal of Engineering Science, 56 (2012) 86-98.

Stark, Not Your Average Heat Shield: New 'Thermal' Approach to Invisibility Cloaking Hides Heat to Enhance Technology, The Optical Society, Mar. 26, 2013.

Schittny et al., Experiments on transformation thermodynamics: Molding the flow of heat, Physical Review Letters, Apr. 1, 2013.

Han et al., Homogeneous Thermal Cloak with Constant Conductivity and Tunable Heat Localization, Scientific Reports, Apr. 3, 2013.

* cited by examiner

DETAILED DESCRIPTION

Reference will now be made in detail to embodiments of heat transfer management apparatuses that include structural features that direct the flow of heat along the heat transfer management apparatuses. The heat transfer management apparatuses include a printed wiring board having an insulator substrate and a thermal conductor at least partially embedded in the insulator substrate. The thermal conductor is arranged relative to electronic components positioned on the printed wiring board. The thermal conductor directs the thermal energy along the printed wiring board in a direction and/or at a rate that differs from the direction and/or rate of the heat flux along an isotropic substrate. By providing a printed wiring board in an anisotropic arrangement, thermal energy may be directed in a direction and/or at a rate that improves operation of the electrical components coupled to the printed wiring board. Various embodiments of the heat transfer management apparatuses will be described in more detail herein.

Figure 1:
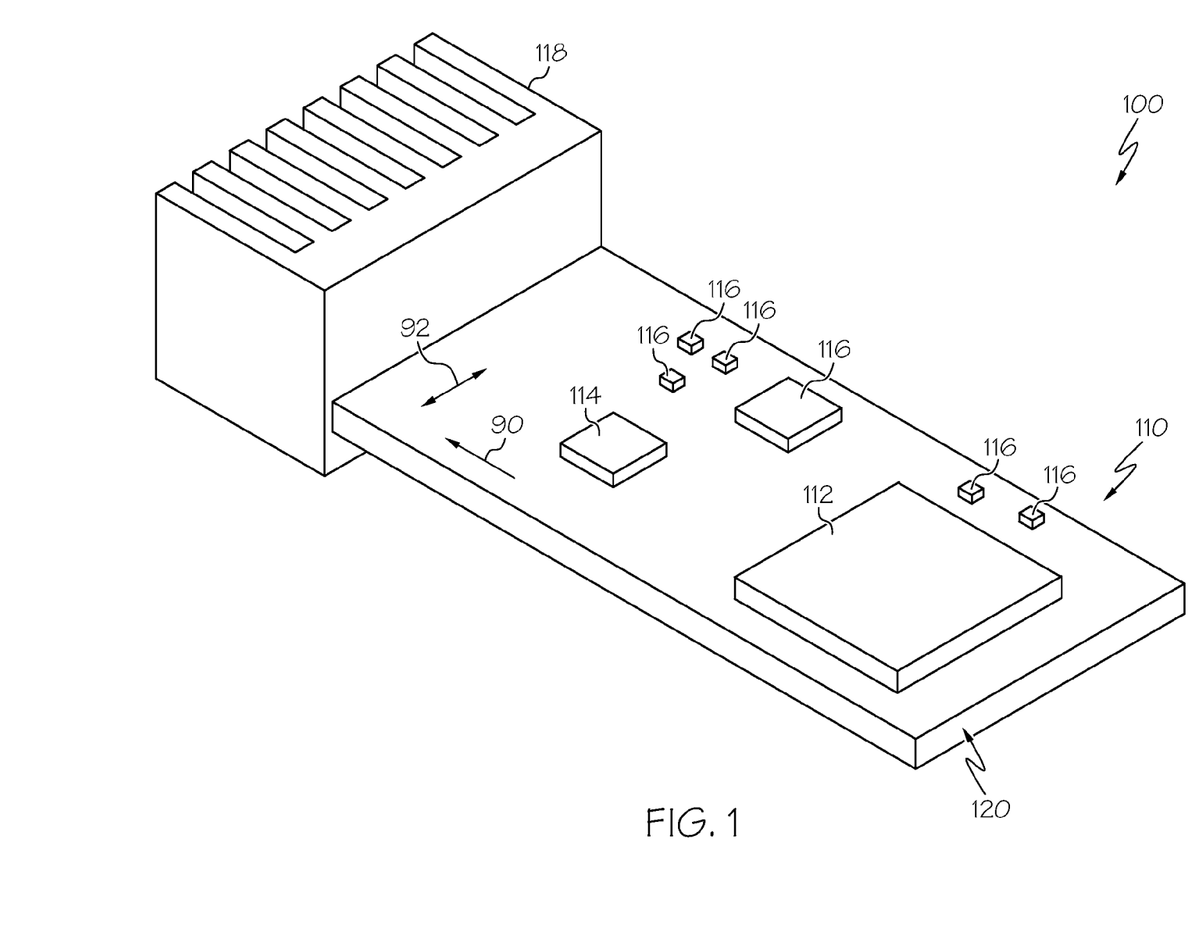

Referring now to FIG. 1, one embodiment of a heat transfer management apparatus 100 is depicted. In this embodiment, the heat transfer management apparatus 100 is a circuit board assembly 110 that includes a printed wiring board 120, a temperature-insensitive component 112 coupled to the printed wiring board 120, and a temperature-sensitive component 114 coupled to the printed wiring board 120. Embodiments according to the present disclosure may also include a plurality of electrical components 116 that are coupled to the printed wiring board 120. The heat transfer management apparatus 100 may also include a heat sink 118 coupled the printed wiring board 120 that is adapted to reject thermal energy into the surrounding environment.

In the embodiment depicted in FIG. 1, the temperature-insensitive component 112 may be a power electronics device that produces heat as a byproduct of its operation. The temperature-insensitive component 112 may be a variety of electronic devices that include integrated circuits, for example, computer processing units, graphical processing units, chipsets, and the like. In some embodiments, the temperature-insensitive component 112 may be a power semiconductor device such as those utilized in power inverters, voltage rectifiers, voltage regulators, and the like. Exemplary power semiconductor devices include, but are not limited to, power insulated-gate bi-polar transistors, metal-oxide field-effect transistors, and the like. In another embodiment, the temperature-insensitive component 112 may include an electric motor or generator. In operation, the temperature-insensitive component 112 generally produces heat as a waste byproduct of the designed operative function of the temperature-insensitive component 112. The heat produced by the temperature-insensitive component 112 in the heat transfer management apparatus is generally undesired, as electrical components are conventionally susceptible to temperature malfunction or permanent failure if an over-temperature condition is realized. Nevertheless, the temperature-insensitive component 112 will continue to operate throughout a wide temperature band.

Additionally, in the embodiment depicted in FIG. 1, the temperature-sensitive component 114 may be selected from a variety of a temperature-sensitive electronic devices including, for example planar coupler, an inductor/transformer, a high-Q resonator, a detector, a current sensing resistor, a crystal oscillator, an aligned optical component, or a human interface control button. Operation of the temperature-sensitive component 114 may be adversely affected by thermal energy that is generated by the temperature-insensitive component 112. Alternatively, in other embodiments, the temperature-sensitive component 114 may be a temperature-sensitive electronic device that operates with increased efficiency with increased thermal energy, for example a thermo-electric generator or a piezo-electric fan. In yet other embodiments, the temperature-sensitive component 114 may be a thermo-mechanical device that operates with increased efficiency with increased temperatures, for example a multi-phase heat pipe, a convective heat sink, and the like. Increased thermal energy directed to such temperature-sensitive components 114 may increase performance of the temperature-sensitive component 114. Accordingly, to manage the temperature of temperature-sensitive components 114 coupled to the printed wiring board 120, the printed wiring board 120 includes a plurality of heat transfer management features that modify the direction and/or intensity of the heat flux that flows along the printed wiring board 120.

Figure 2:
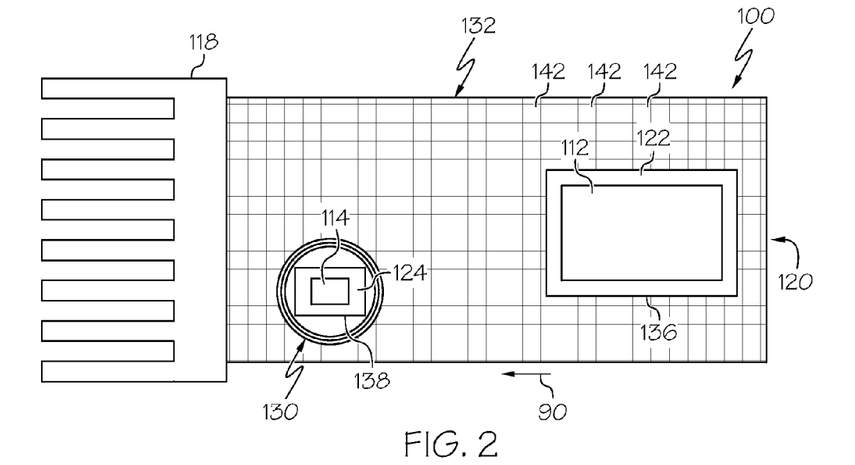
Figure 3:
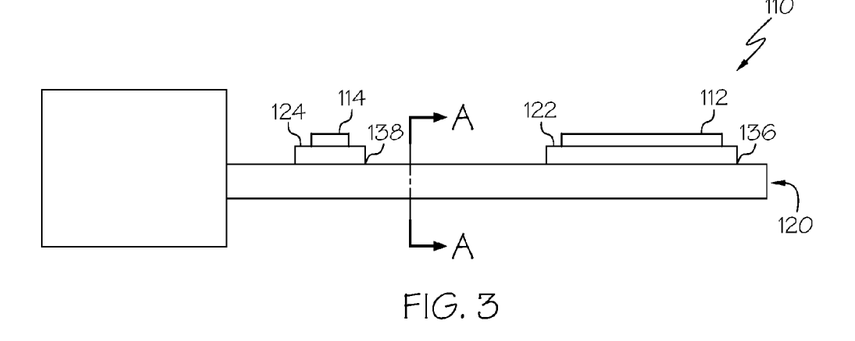
Figure 4:
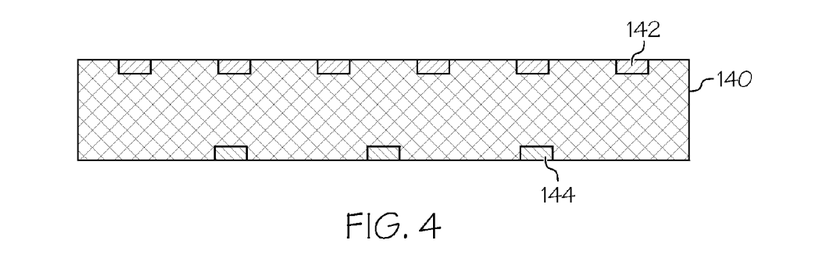

Referring now to FIGS. 2-4, the embodiment of the heat transfer management apparatus 100 depicted includes a printed wiring board 120 that includes an insulator substrate 140, a thermal conductor 142 that is at least partially embedded in the insulator substrate 140, and an electrical conductor 144 that is at least partially embedded in the insulator substrate 140. The printed wiring board 120 also includes at least one electronic component attachment module 122, 124, each of which are coupled to the printed wiring board 120. The electronic component attachment modules 122, 124 provide an electrical connection between the respective temperature-insensitive or temperature-sensitive component 112, 114 and the electrical conductor 144 that is incorporated into the printed wiring board 120. A plurality of electronic leads may extend through the insulator substrate 140 from the electronic component attachment modules 122, 124 to the electrical conductor 144 in a series of vias, as conventionally known. The electronic component attachment modules 122, 124 may secure the respective temperature-insensitive or temperature-sensitive component 112, 114 with a snap-in fit or by attachment through a locking retention collar or a thermal pad (not shown). In other embodiments, the temperature-insensitive and/or temperature-sensitive components 112, 114 may be coupled to the printed wiring board 120 and placed into electrical continuity with the electrical conductor 144, for example by soldering or welding.

In the embodiment depicted in FIGS. 2-4, the printed wiring board 120 includes the thermal conductor 142 and the electrical conductor 144 that are positioned to be at least partially embedded within the insulator substrate 140. The thermal conductor 142 may be selected from any of a variety of materials having high thermal conduction properties, including, for example, copper, silver, gold, and alloys thereof. The thermal conductor 142 may have a thermal conductivity, $k_c$, that is greater than the thermal conductivity of the insulating substrate, $k_i$, including where $k_c$ is at least an order of magnitude greater than $k_i$. Similarly, the electrical conductor 144 may be selected from any of a variety of materials having high electronic conduction properties, including, for example, copper, silver, gold, and alloys thereof. The insulator substrate 140 may be selected from any of a variety of materials having low electronic conductivity, including, for example, plastics such as polypropylene, polyester, nylon, epoxy and the like, which may be combined with carbon or glass reinforcement. In one embodiment, the insulator substrate 140 may be made from FR-4, which is a glass-reinforced epoxy. The insulator substrate 140 has a thermal conductivity, $k_c$, that is less than the thermal conductivity of the thermal conductors, $k_c$.

As depicted in FIGS. 2-4, the embodiment of the printed wiring board 120 includes a bulk region 132 having a lattice of inter-connected strands of thermal conductor 142 that is at least partially embedded along one side of the insulator substrate 140. The lattice of the thermal conductor 142 in the bulk region 132 is generally arranged in an orientation that encourages heat generated at the temperature-insensitive component 112 to flow towards the heat sink 118. In the depicted embodiment, the lattice includes a plurality of square-shaped cells that are defined by the thermal conductor 142. It should be understood that various configurations of such lattices, including having various polygonal shapes, widths, depths, and lengths, may be incorporated into the printed wiring board 120 without departing from the scope of the present disclosure. In the depicted embodiment, the lattice of the thermal conductor 142 includes strands that extend in the principal direction 90 from the temperature-insensitive component 112 towards the heat sink 118 and in a cross-direction 92 transverse to the principal direction 90 from the temperature-insensitive component 112 towards the heat sink 118. By directing the thermal energy in the cross-direction 92, an increased proportion of the thermal conductor 142 may be used to direct thermal energy to the heat sink 118, which may increase the efficacy of the printed wiring board 120 of rejecting heat from the temperature-insensitive component 112 to the heat sink 118 and into the surrounding environment.

The printed wiring board 120 also includes a targeted heat transfer region 130 that is positioned proximate to the temperature-sensitive component 114. The targeted heat transfer region 130 includes an arrangement of thermal conductor 142 that surrounds the temperature-sensitive component 114. The thermal conductor 142 of the targeted heat transfer region 130 may be in thermal continuity with the thermal conductor 142 of the bulk region 132, so that heat flux flows readily along the thermal conductor 142 between the bulk region 132 and the targeted heat transfer region 130. Thermal continuity between the thermal conductor 142 of the bulk region 132 and the targeted heat transfer region 130 may be verified by evaluating electrical continuity between the bulk region 132 and the targeted heat transfer region 132 for thermal conductors 142 that are also electrically conductive. In these embodiments, the bulk region 132 and the targeted heat transfer region 130 may steer heat flux away from the temperature sensitive component 114. The targeted heat transfer region 130 modifies the thermal conductivity and/or thermal capacitance of the printed wiring board 120 at positions proximate to the targeted heat transfer region 130, while generally maintaining the conductive heat transfer at positions located distally from the targeted heat transfer region 130. By modifying the thermal conductivity of the printed wiring board 120, steady state heat transfer along the printed wiring board 120 can be controlled. Similarly, by modifying the thermal capacitance of the printed wiring board 120, transient thermal response of the printed wiring board 120 to variations in heat flux can be controlled.

Figure 5:
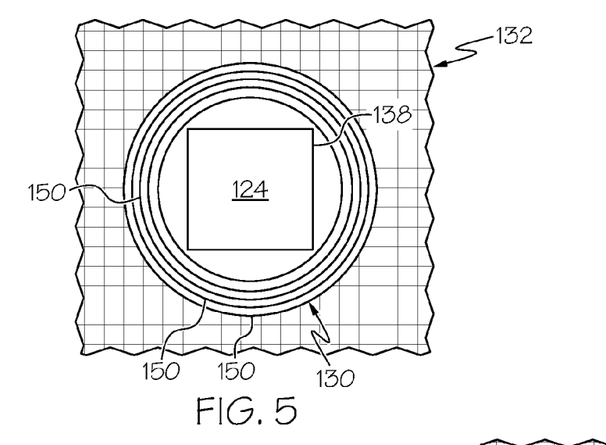
Figure 6:
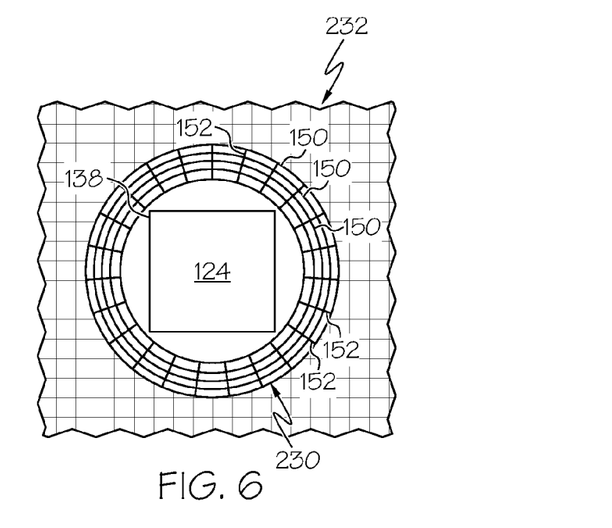
Figure 7:
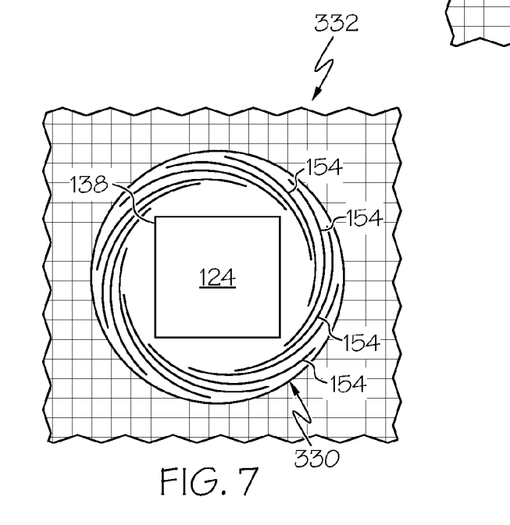

Various embodiments of the targeted heat transfer region 130, 230, 330 are depicted in greater detail in FIGS. 5-7. While the targeted heat transfer regions 130, 230, 330 depicted herein are generally circular in shape, it should be understood that embodiments of the targeted heat transfer regions 130, 230, 330 according to the present disclosure are not intended to be limited by geometric shape. Accordingly, various embodiments of the targeted heat transfer regions 130, 230, 330 may exhibit a variety of shapes and configurations. In the embodiment depicted in FIG. 5, the targeted heat transfer region 130 includes thermal management features that are defined by a composite structure of the thermal conductor 142 and the insulator substrate 140 where the thermal conductor 142 is arranged in concentric rings 150 that encapsulate a temperature-sensitive component mounting region 138, here the second electronic component attachment module 124. The rings 150 of the targeted heat transfer region 130 are free from intersection with one another, and are separated from one another by insulator substrate 140. The outer-most ring 150 may be in thermal continuity with the lattice of thermal conductor 142 positioned along the insulator substrate 140 in the bulk region 132.

The rings 150 of the targeted heat transfer region 130 direct thermal energy along the rings 150 while decreasing the heat flux through the targeted heat transfer region 130. Accordingly, the targeted heat transfer region 130 may reduce the amount of thermal energy that flows into the temperature-sensitive component 114. As such, the targeted heat transfer region 130 may mask the temperature-sensitive component 114 from heat flux that is otherwise directed along the printed wiring board 120. Incorporation of the targeted heat transfer region 130 may be useful in applications in which the temperature-sensitive component 114 is sensitive to the temperature at which it operates and/or time variations in temperature across the dimensions of the temperature-sensitive component 114. The rings 150 of the targeted heat transfer region 130 may reduce the temperature drop evaluated across the targeted heat transfer region 130 in the principal direction 90 of heat flux. The reduction in temperature drop, and the corresponding reduction in heat flux directed across the targeted heat transfer region 130 may provide an amount of thermal isolation of the temperature-sensitive component 114 from the temperature-insensitive component 112, while maintaining electrical continuity within the printed wiring board 120.

The targeted heat transfer region 130 depicted in FIG. 5 may create a generally isothermal region in the printed wiring board 120 by maintaining even temperatures across the temperature-sensitive component mounting region 138 when a temperature gradient is otherwise maintained on the printed wiring board 120. The isothermal region, therefore, may be indicative of a reduce temperature variation within the targeted heat transfer region 130, which may be beneficial for heat-sensitive electrical components that perform adversely when subjected to thermal gradients.

The thermal management features of the targeted heat transfer region 130, here the rings 150, may be selected so that the effective thermal conductivity of the targeted heat transfer region 130 is similar to that of the bulk region 132. This may be evaluated by comparing the reduced average thermal conductivity of the targeted heat transfer region 130 and the bulk region 132 (i.e., $k_b = f \cdot k_c + (1-f) \cdot k_s$), where $k_b$ is the of the reduced average thermal conductivity of the bulk region 132, $k_c$, is the thermal conductivity of the thermal conductor 142, $k_s$ is the thermal conductivity of the insulator substrate 140, and f is the volume fraction of the thermal conductor 142 within the bulk region 132). Additionally, in some embodiments, the width and the depth of the rings 150 may vary relative to one another and/or along their lengths to vary the thermal capacitance of the targeted heat transfer region 130. In some embodiments, the effective thermal conductivity of the targeted heat transfer region 130 is within about 10% of the effective thermal conductivity of the bulk region 132. In other embodiments, the effective thermal conductivity of the targeted heat transfer region 130 is within about 5% of the effective thermal conductivity of the bulk region 132. In yet other embodiments, the effective thermal conductivity of the targeted heat transfer region 130 is approximately equal to the effective thermal conductivity of the bulk region 132. Minimization of the difference between the effective thermal conductivity between the targeted heat transfer region 130 and the bulk region 132 may reduce the disruption of heat flux at positions spaced apart from the targeted heat transfer region 130.

Referring now to FIG. 6, another embodiment of the targeted heat transfer region 230 is depicted. The targeted heat transfer region 230 includes a composite structure of the thermal conductor 142 and the insulator substrate 140 where the thermal conductor 142 is arranged in rings 150 that encapsulate a temperature-sensitive component mounting region 138, here the second electronic component attachment module 124, and a plurality of spokes 152 that extend radially between the concentric rings 150 to place the concentric rings 150 into thermal continuity with one another. While the spokes 152 depicted in FIG. 6 are arranged in a radial orientation, it should be understood that the spokes 152 may be arranged in a variety of configurations based on the requirements of the application. The outer-most ring 150 may be in thermal continuity with the lattice of thermal conductor 142 positioned along the insulator substrate 140.

The concentric rings 150 and the spokes 152 of the targeted heat transfer region 230 direct heat flux along the spokes 152 and between the rings 150 so that the heat flux through the targeted heat transfer region 230 increases as compared with the bulk region 132 of the printed wiring board 120 incorporating the thermal conductor 142 and the insulating substrate 140 in the lattice-like arrangement. In this embodiment, the targeted heat transfer region 230 encapsulates the temperature-sensitive component mounting region 138, while the thermal conductor 142 in the lattice-like arrangement is positioned around the temperature-insensitive component mounting region 136 of the printed wiring board 120. Accordingly, the targeted heat transfer region 230 may increase heat flux that flows into the temperature-sensitive component 114. As such, the targeted heat transfer region 230 may concentrate thermal energy towards the temperature-sensitive component 114. Incorporation of the targeted heat transfer region 230 may be useful in applications in which the temperature-sensitive component 114 performs with improved efficiency at elevated temperature gradients, for example with thermoelectric components. The spokes 152 between the concentric rings 150 of the targeted heat transfer region 230 may increase the temperature drop evaluated across the targeted heat transfer region 230 in the principal direction 90 of heat flux. The increase in temperature drop, and the corresponding increase in heat flux directed across the targeted heat transfer region 230, may provide an amount of thermal amplification of the temperature-sensitive component 114 from heat generated by the temperature-insensitive component 112, while maintaining electrical continuity within the printed wiring board 120.

Referring now to FIG. 7, yet another embodiment of the targeted heat transfer region 330 is depicted. The targeted heat transfer region 330 includes a composite structure of the thermal conductor 142 and the insulator substrate 140 where the thermal conductor 142 is arranged in a plurality of spokes 154 that extend in a spiraled orientation to encapsulate a temperature-sensitive component mounting region 138, here the second electronic component attachment module 124. While the spokes 154 depicted in FIG. 7 are arranged in a spiral orientation in which the radius of the spoke 154 decreases with increasing distance from the lattice-like region, it should be understood that the spokes 154 may be arranged in a variety of configurations depending on the requirements of the application.

The spokes 154 of the targeted heat transfer region 330 direct thermal energy along the spokes 154 and away from travelling in a linear direction through the targeted heat transfer region 330 so that the thermal energy introduced to the targeted heat transfer region 330 is turned to follow the direction of the spokes 154. As such, the targeted heat transfer region 330 may direct thermal energy around the temperature-sensitive component 114, thereby turning the direction of conveyance of thermal energy within the targeted heat transfer region 330. In some embodiments, the targeted heat transfer region 330 may turn the heat flux such that the temperature drop evaluated along the interior of the targeted heat transfer region 330 proximate to the temperature-sensitive component mounting region 138 is inverted from the temperature drop evaluated along the exterior of the targeted heat transfer region 330. Incorporation of the targeted heat transfer region 330 may be useful in applications in which the temperature-sensitive component 114 performs with improved efficiency when heat flows in a particular direction. The decrease in temperature drop, and the corresponding decrease in heat flux directed across the targeted heat transfer region 330, may provide an amount of thermal isolation of the temperature-sensitive component 114 from heat generated by the temperature-insensitive component 112, while maintaining electrical continuity within the printed wiring board 120.

Incorporating targeted heat transfer regions 130, 230, 330 according to the present disclosure into printed wiring boards 120 may allow for modifying the conductive heat transfer along the surface of the printed wiring boards 120. As discussed hereinabove, when embodiments of the circuit board assembly include electrical components that perform adversely when subjected to elevated temperatures or high temperature gradients, targeted heat transfer zones regions that shield the electrical component from heat flux or turn the heat flux to reduce the introduction of thermal energy to the electrical component may be desired. In these embodiments, incorporation of a targeted heat transfer zone may allow for temperature-sensitive components to be mounted to the printed wiring board for electrical continuity, while minimizing any effects of elevated temperature on the temperature-sensitive electrical components. Additionally, as noted hereinabove, the targeted heat transfer zones may be configured with alternative geometric shapes to provide shape the thermal environment along the printed wiring boards that surround the temperature-sensitive components.

Similarly, for electrical components that operate with increased efficiency at elevated temperatures, embodiments of the circuit board assembly may incorporate targeted heat transfer regions that focus the heat flux towards the electrical component, thereby increasing the temperature surrounding the electrical component. In these embodiments, the increase in temperature may improve the performance of the temperature-sensitive electrical component. Accordingly, by focusing the thermal energy towards the temperature-sensitive electrical component, improved performance of the temperature-sensitive electrical component may be realized.

Referring again to FIGS. 2-4, it should be understood that the electrical conductor 144 and the insulator substrate 140 may convey thermal energy from the temperature-insensitive component 112 towards the heat sink 118 and/or the temperature-sensitive component 114, in addition to the thermal energy that is conveyed by the thermal conductor 142. However, the thermal conductor 142 may exhibit a thermal conductivity (based on the thermal conductivity and the width and thickness of the thermal conductor 142) that is greater than the thermal conductivity of the insulator substrate 140 and the electrical conductor 144. Because the thermal conductivity of the thermal conductor 142 is greater than the insulator substrate 140 and the electrical conductor 144, a substantial portion of the thermal energy emitted by the temperature-insensitive component 112 may be directed by the thermal conductor 142. Particular designs of the printed wiring boards 120 according to the present disclosure may account for the location, dimensions, and the thermal conductivity of the insulator substrate 140 and the electrical conductor 144 when the position of the thermal conductor 142 is determined. Accordingly, design of the printed wiring boards 120 may account for both the thermal dissipation and electrical continuity requirements of the various electrical components of the circuit board assembly 110.

In some embodiments, the thermal conductor may place the temperature-insensitive component into electrical continuity with the temperature-sensitive component, so that no additional electrical conductor is required in the printed wiring board. In these embodiments, the thermal conductor is configured to direct the flow of heat flux along the printed wiring board while simultaneously maintaining electrical continuity between components mounted to the printed wiring board including, for example, the temperature-sensitive component and the temperature-insensitive component. In such embodiments, the thermal conductor, therefore, conducts both thermal and electrical energy.

Figure 8:
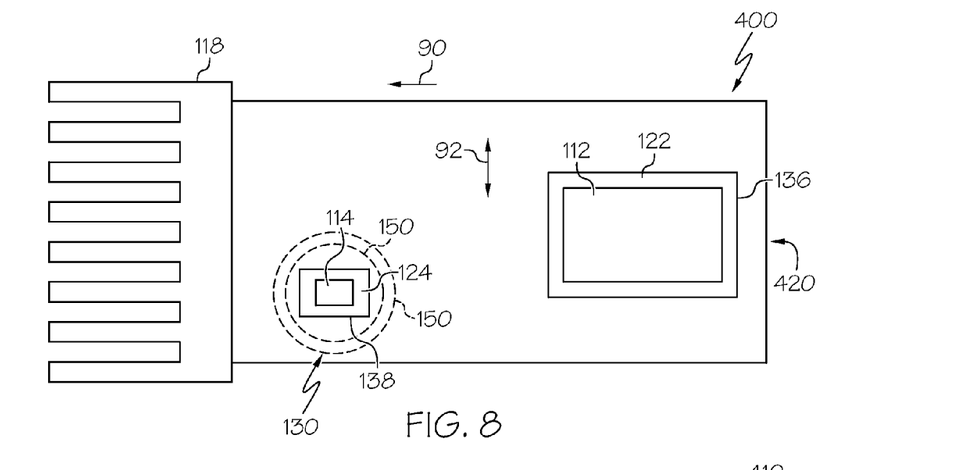
Figure 9:
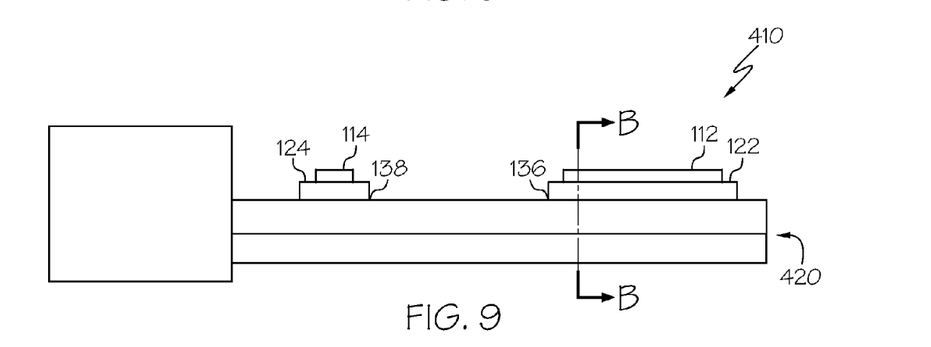
Figure 10:
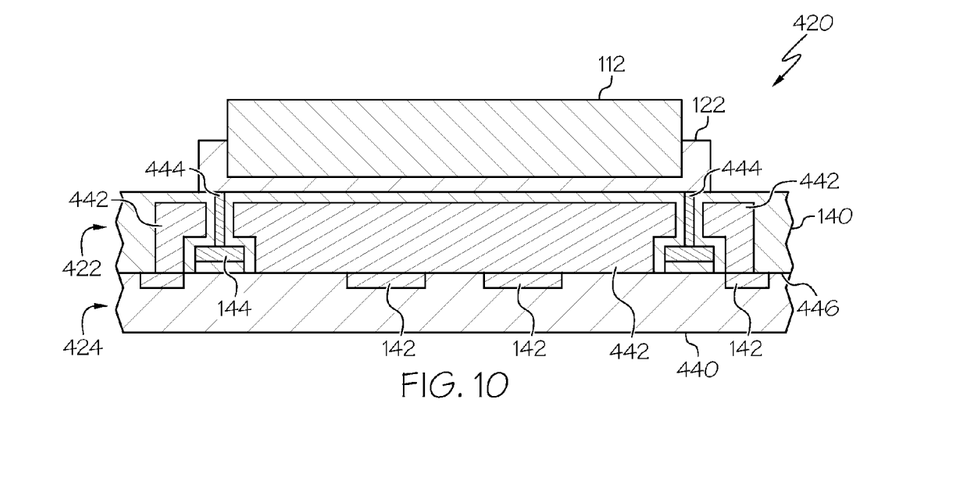

Referring now to FIGS. 8-10, another embodiment of a heat transfer management apparatus 400 is depicted. In this embodiment, the heat transfer management apparatus 400 includes a printed wiring board 420 having a plurality of laminates 422, 424. In the embodiment depicted in FIGS. 8-10, the printed wiring board 420 includes a first laminate 422 and a second laminate 424. It should be understood that printed wiring boards 420 according to the present disclosure may include any number of laminates based on the requirements of the particular application. The first laminate 422 includes a first electronic component attachment module 122 and a second electronic component attachment module 124 to which a temperature-insensitive component 112 and a temperature-sensitive component 114, respectively, may be coupled. The first laminate 422 of the printed wiring board 420 also includes a plurality of electrical conductors 144 that are at least partially embedded in the insulator substrate 140. In the depicted embodiment, the electrical conductors 144 are positioned along an interior face of the first laminate 422 opposite the first and second electronic component attachment module 122, 124. The electronic component attachment modules 122, 124 are maintained in electrical continuity with the electrical conductors 144. In the depicted embodiment, a plurality of electronic leads 444 extend from the first and second electronic component attachment modules 122, 124 to the electrical conductors 144 and place the first and second electronic component attachment modules 122, 124 in electrical continuity with the electrical conductors 144.

The first laminate 422 also includes an embedded thermal conductor 442. The embedded thermal conductor 442 is at least partially embedded within the insulator substrate 140 and is electrically isolated from the electrical conductor 144. In the embodiment depicted in FIGS. 8-10, the embedded thermal conductor 442 is spaced apart from the exterior face of the first laminate 422 along which the first and second electronic component attachment modules 122, 124 are positioned. The embedded thermal conductor 442 is exposed along the interior face of the first laminate 422 opposite the first and second electronic component attachment modules 122, 124.

The second laminate 424 includes an insulator substrate 440 and a thermal conductor 142 at least partially embedded in the insulator substrate 440. In the embodiment depicted in FIGS. 8-10, the thermal conductor 142 is positioned along the top face of the second laminate 424. The thermal conductor 142 may be arranged in a variety of configurations, including being positioned in a lattice, similar to that described in regard to FIGS. 2-4 above. The thermal conductor 142 is positioned to be spaced apart from the electrical conductor 144, so that the thermal conductor 142 and the electrical conductor 144 remain electrically isolated from one another. The thermal conductor 142 is placed into thermal conductivity with the embedded thermal conductor 442 of the first laminate 422.

The second laminate 424 also includes a targeted heat transfer region 130 that is at least partially embedded within the insulator substrate 440 of the second laminate 424. Similar to the embodiments of the targeted heat transfer region 130 described hereinabove, the targeted heat transfer region 130 may modify the local thermal conductivity of the printed wiring board 420 to shape the heat flux that is directed along the printed wiring board 420. Embodiments of the targeted heat transfer regions 130 may shield the temperature-sensitive component 114 from thermal energy generated by the temperature-insensitive component 112 or may focus the thermal energy from the temperature-insensitive component 112 towards the temperature-sensitive component 114.

Electrical signals are conveyed to and from the temperature-insensitive component 112 through the electrical conductors 144. Heat generated by the temperature-insensitive component 112 is directed into the first laminate 422 of the printed wiring board 420. A substantial portion of the thermal energy generated by the temperature-insensitive component 112 is directed into the embedded thermal conductor 442 of the first laminate 422. Thermal energy is directed along the printed wiring board 420 from the embedded thermal conductor 442 to the thermal conductor 142 of the second laminate 424, along a thermal path towards the heat sink 118 and/or the temperature-sensitive component 114. Thermal energy from the temperature-insensitive component 112 is selectively shielded from, focused towards, or guided in relation to the temperature-sensitive component 114, based on the configuration of the targeted heat transfer region 130.

It should be understood that a variety of configurations of the multi-laminate printed wiring board 420 may incorporate thermal conductors 142 and electrical conductors 144 that are electrically isolated from one another so that the conveyance of heat flux along the printed wiring board 420 may be controlled to provide a desired effect, while maintaining electrical continuity between electrical components mounted to the printed wiring board 420. Additional laminate layers incorporating electrical components, thermal conductors, and/or electric conductors into an insulator substrate 440 may be included in the circuit board assembly 410 so that the desired electronic assembly are able to reject heat into the surrounding environment, shielding or focusing the thermal energy towards the temperature-sensitive electronics components as required. Accordingly, it should be understood that embodiments of the printed wiring board 420 according to the present disclosure may be designed to account for both the thermal dissipation and electrical continuity requirements of the various electrical components of the circuit board assembly 410. Further, the thermal conductors 142 and the electrical conductors 144 of the printed wiring board 420 may be separated from one another by insulator substrate 440 so that the heat flux can be selectively directed along the thermal conductor 142, minimizing the effects of the thermal conductivity of the electrical conductors 144.

In yet further embodiments of multi-laminate printed wiring boards, thermal conductors of certain layers may both provide thermal and electrical continuity to the components of the heat transfer management apparatus. In some embodiments, electrical continuity between the components of the heat transfer management apparatus may be directed to printed wiring boards that are spaced apart from the printed wiring board to which the components are mounted. In such embodiments, the thermal continuity and the electrical continuity between components may be maintained through alternate layers of the multi-laminate printed wiring board.

Figure 11:
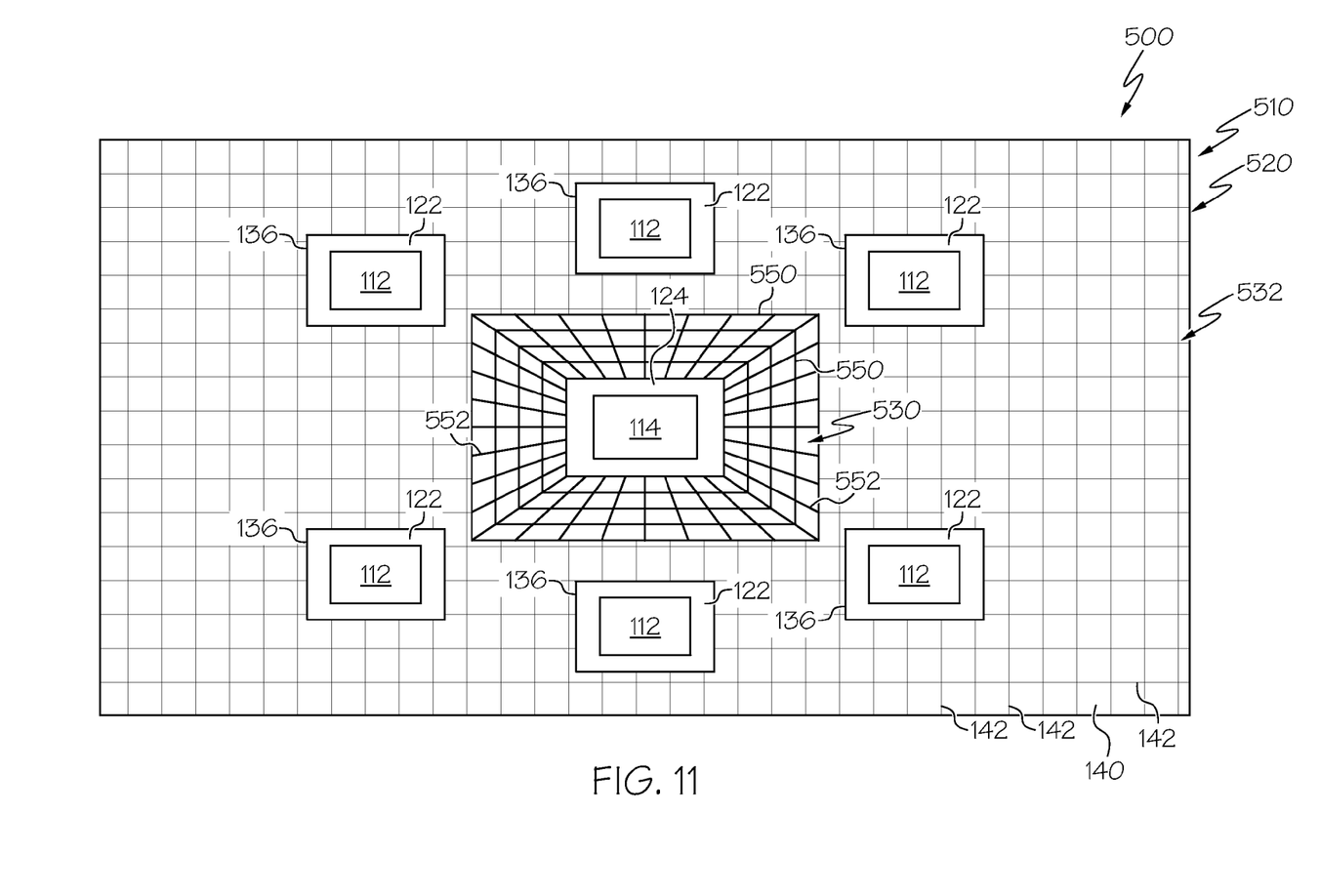

Referring now to FIG. 11, another embodiment of a heat transfer management apparatus 500 incorporating a circuit board assembly 510 is depicted. In this embodiment, the circuit board assembly 510 includes a printed wiring board 520 having a plurality of electronic component attachment modules 122 and at least one second electronic component attachment modules 124. A temperature-insensitive component 112 is attached to each of the electronic component attachment modules 122 and a temperature-sensitive component 114, here a temperature-sensitive electrical component, is coupled to the second electronic component attachment module 124. Similar to embodiments discussed hereinabove, the printed wiring board 520 also includes a thermal conductor 542 that is at least partially embedded into an insulator substrate 540. The thermal conductor 542 is adapted to conduct heat along its elements. In the embodiment depicted in FIG. 11, the thermal conductor 542 is arranged in to a lattice having a plurality of strands that are in thermal conductivity with one another. The thermal conductor 142 also is arranged into a targeted heat transfer region 530. The targeted heat transfer region 530 includes a modified pattern as compared to the bulk region 532 of the thermal conductor 142, so that the direction of heat flux in the bulk region 532 differs from that in the targeted heat transfer region 530.

In the embodiment depicted in FIG. 11, the targeted heat transfer region 530 directs thermal energy from each of the temperature-insensitive components 112 toward the temperature-sensitive component 114, focusing the thermal energy from the temperature-insensitive components 112 to the temperature-sensitive component 114. Such a configuration may be suitable for applications in which the temperature-sensitive component 114 is a temperature-sensitive electrical component that operates with increased efficiency at elevated temperatures. The configuration of the temperature-insensitive components 112, the temperature-sensitive component 114, and the targeted heat transfer region 530 may increase the heat flux that is directed to the temperature-sensitive component 114.

Figure 12:
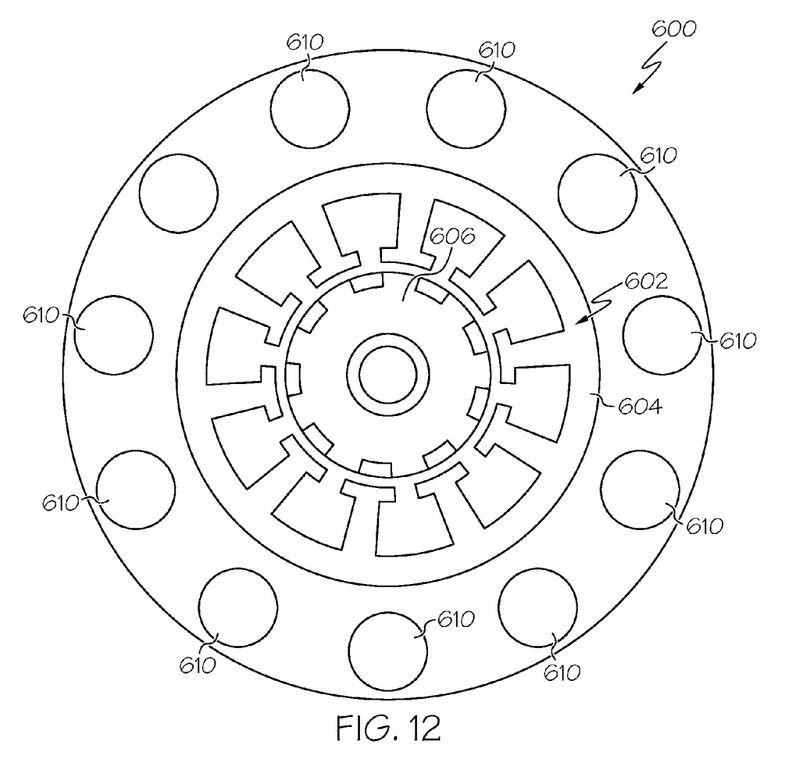
Figure 13:
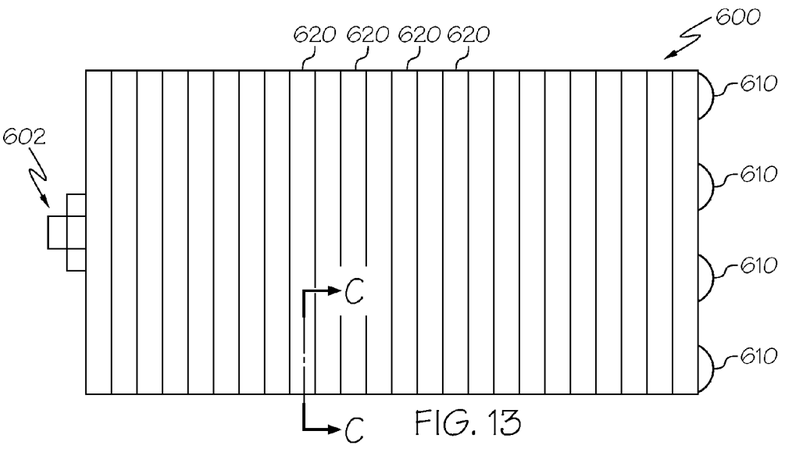
FIG. 13 schematically depicts a side view of a heat transfer management apparatus having a printed wiring board according to one or more embodiments shown or described herein.
Figure 14:
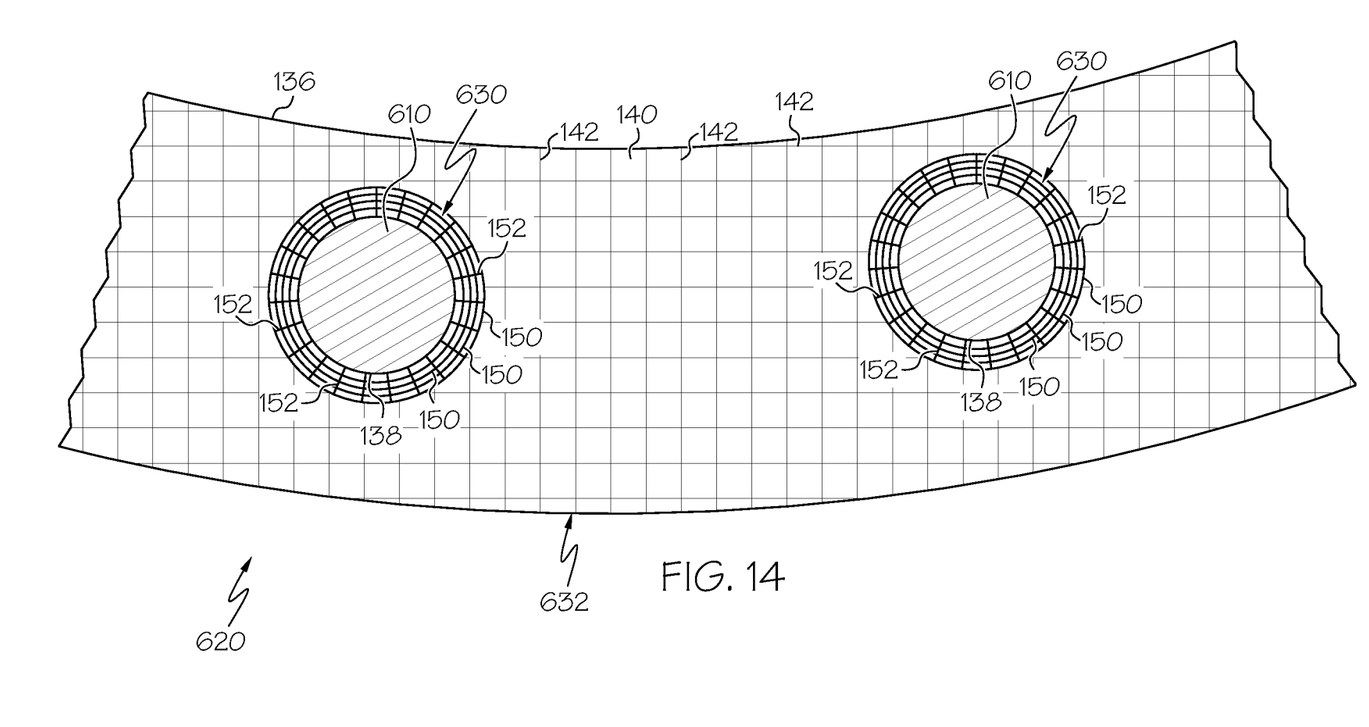
FIG. 14 schematically depicts a detailed front sectional view of a heat transfer management apparatus having a printed wiring board shown along line C-C of FIG. 13 according to one or more embodiments shown or described herein.

Referring now to FIGS. 12-14, another embodiment of the heat transfer management apparatus 600 is depicted. In this embodiment, the heat transfer management apparatus 600 includes a plurality of printed wiring boards 620 that are assembled around an electric motor 602. The electric motor 602 includes a rotor 606 that is adapted to rotate within a stator 604, generating a motive force of the rotor. In the depicted embodiment, the strength of the motive force is based on the amount of electricity passing through the windings (not shown) of the stator 604 and the strength of the magnetic force of the rotor 606. As the amount of electricity passing through the windings increases, the motive force provided by the rotor 606 generally increases.

The increase in electricity passing through the windings, however, generally corresponds to an increase in the operating temperature of the electric motor 602. To manage the temperature of the stator 604 of the electric motor 602, the heat transfer management apparatus 600 may include a plurality of heat extraction devices 610 that draw heat flux away from the stator 604, thereby reducing the temperature of the stator 604. that draw heat flux away from the stator 604, thereby reducing the temperature of the stator 604. The heat extraction devices 610 may perform with increased efficiency at elevated temperatures and/or at elevated temperature gradients, so that the heat extraction devices 610 are temperature-sensitive components. In some embodiments, the heat extraction devices 610 may be, for example and without limitation, heat pipes, thermo-electric coolers, convective heat sinks, and the like.

Referring now to FIG. 14, one of the printed wiring boards 620 is depicted. In this embodiment, the printed wiring board 620 includes a thermal conductor 142 that is at least partially embedded in an insulator substrate 140. The thermal conductor 142 is arranged into a bulk region 632 and a plurality of targeted heat transfer region 630, where the thermal conductivity of the bulk region 632 is less than the thermal conductivity of the targeted heat transfer region 630. In the embodiment depicted in FIG. 14, the targeted heat transfer region 630 includes a plurality of rings 150 that are arranged in a concentric relationship with one another, and a plurality of spokes 152 that are arranged in a radial relationship and interconnect the plurality of rings 150 with one another. As discussed hereinabove, the targeted heat transfer region 630 tends to focus heat flux from the temperature-insensitive component (here, the stator 604) to direct heat flux into the heat extraction devices 610. By increasing the heat flux across each of the targeted heat transfer regions 630, thermal energy that is rejected from the stator 604 may be directed to the heat extraction devices 610 with high efficiency. Increasing the efficiency of heat rejection may decrease the quantity of heat extraction devices 610 that are required to maintain the temperature of the stator 604 across the design envelope. Additionally, in this embodiments, the bulk region 632 and the targeted heat transfer region 360 of the composite laminae 620 may steer heat flux towards the heat extraction devices 610 (i.e., the temperature sensitive components). Accordingly, incorporation of the targeted heat transfer regions 630 may reduce the cost and complexity of the heat transfer management apparatus 600.

It should now be understood that heat transfer management apparatuses according to the present disclosure may include printed circuit boards having an insulator substrate, an electrical conductor at least partially embedded in the insulator substrate, and a thermal conductor at least partially embedded in the substrate. The thermal conductor is arranged in a targeted heat transfer region and a bulk region. The thermal conductivity of the printed circuit board is locally modified by the thermal conductor, such that heat flux flowing along the printed circuit board is modified in the targeted heat transfer region as compared with the bulk region. The modification of the flow of thermal energy in the targeted heat transfer region allows for temperature sensitive components to be located on the printed circuit board and perform with increased efficiency as compared to locating the temperature sensitive components on the bulk region.

EXAMPLES

Four samples were prepared for testing to evaluate the heat transfer properties offered by the various targeted heat transfer regions discussed hereinabove. Standard coupons were made using RO4350B material as the insulator substrate, having thermal conductivity of 0.69 W/(m·K). The coupons had overall lengths of 115 mm and widths of 50 mm. The insulator substrate had a thickness of 508 µm. Silver-plated copper having a thermal conductivity of 400 W/(m·K) was formed into the bulk region with a thickness of 35 µm along both the top and bottom surfaces of the insulator substrate through chemical etching, giving the printed circuit board coupon a total thickness of 578 µm. The silver-plated copper was arranged in the bulk region with a thickness of 200 µm with a plurality of square-shaped cells having a length and a width dimension of 2.5 mm. Thermal bus bars a complete distribution of silver-plated copper extending 37.5 mm from both ends of the insulator substrate were incorporated to provide even heat inflow and outflow to the region of interest, the 40 mm at the center of the coupon. A thin uniform coating of high emissivity ($\epsilon$=0.96~0.98) flat black paint, Krylon 1618, was applied to the region of interest of each coupon to facilitate accurate thermal imaging. The thermal contours on the exposed topside of each composite structure were obtained via a calibrated IR camera (FLIR SC7650) positioned directly above the test apparatus. Temperature gradients across corresponding to the inner diameter of the concentric rings having a diameter of 10 mm were measured.

Power was applied to each of the coupons with a 30 mm×30 mm×50 mm copper block heater with a center hole machined lengthwise to receive a single 120 V cartridge heater with a maximum power of 50 W. A direct-to-air thermoelectric cooler with a maximum cooling power of 11 W was positioned opposite the heaters and used as a heat sink. The testing apparatus was surrounded by insulation except for the area of interest, which was exposed to the ambient air environment.

Computer simulation models were constructed to simulate the steady-state heat transfer of each of the test cases.
Baseline A baseline coupon was prepared with no targeted heat transfer region such that the bulk region having a plurality of square-shaped cells extended along the region of interest.

With power applied to the baseline coupon to establish a temperature differential of 35 K across the region of interest, the temperature gradient evaluated at a distance corresponding to the inner diameter of the concentric rings of the other coupons was evaluated to be $\nabla T \approx 8.3$ K/cm. In comparison, simulation modeling indicated that the temperature gradient would be $\nabla T \approx 9$ K/cm.
Sample 1

A coupon having a targeted heat transfer region corresponding to FIG. 5 having a plurality of concentric rings was produced having nine 250 µm-wide concentric copper rings, each of rings being spaced evenly apart from one another, where the outer diameter of the concentric rings was 18.5 mm and the inner diameter was 10 mm.

With power applied to the baseline coupon to establish a temperature differential of 35 K across the region of interest, the temperature gradient evaluated across the inner diameter of the concentric rings was evaluated to be $\nabla T \approx 0.22$ K/cm. In comparison, simulation modeling indicated that the temperature gradient would be $\nabla T \approx 0.86$ K/cm.
Sample 2

A coupon having a targeted heat transfer region corresponding to FIG. 6 having a plurality of concentric rings with radial spokes interconnecting the concentric rings was produced having two 250 µm-wide concentric copper rings, the outer ring having an outer diameter of 18.5 mm and the inner ring having an inner diameter of 10 mm. The sample included 90 radial spokes evenly arrayed around the concentric rings and connecting the outer ring and the inner ring. Each spoke had a thickness at the inner ring of 175 µm, the thickness increasing towards the outer ring so that each spoke traversed approximately 2°.

With power applied to the baseline coupon to establish a temperature differential of 35 K across the region of interest, the temperature gradient evaluated across the inner diameter of the concentric rings was evaluated to be $\nabla T \approx 16.7$ K/cm. In comparison, simulation modeling indicated that the temperature gradient would be $\nabla T \approx 19.5$ K/cm.
Sample 3

A coupon having a targeted heat transfer region corresponding to FIG. 7 having a plurality of spiraled spokes was produced having an outer diameter of 25 mm and an inner diameter of 10 mm. The sample included 16 equally-spaced logarithmic spiral copper spoke that wrapped approximately 300° around the inner diameter. Each spiral spoke was tapered and had a width of 177 µm at the inner diameter and 414 µm at the outer diameter.

With power applied to the baseline coupon to establish a temperature differential of 35 K across the region of interest, the temperature gradient evaluated across the inner diameter of the concentric rings was evaluated to be $\nabla T \approx 1.1$ K/cm, where the temperature gradient is negative, indicating that heat flux flowed in reverse across the targeted heat transfer region, the heat flux being effectively turned. In comparison, simulation modeling indicated that the negative temperature gradient would be $\nabla T \approx 1.9$ K/cm.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:
1. A printed wiring board comprising:
an insulator substrate;
an electrical conductor at least partially embedded in the insulator substrate;
a thermal conductor at least partially embedded in the insulator substrate and electrically isolated from the electrical conductor;
a first mounting region; and
a second mounting region,
wherein the insulator substrate and the thermal conductor are arranged into:
a targeted heat transfer region proximate to the second mounting region, wherein the targeted heat transfer region comprises an arrangement of the thermal conductor that completely surrounds the second mounting region, and
a bulk region at positions spaced apart from the second mounting region, wherein the bulk region comprises a lattice arrangement of the thermal conductor in thermal continuity with the thermal conductor of the targeted heat transfer region.

2. The printed wiring board of claim 1, further comprising an electronic component attachment module positioned proximate to the bulk region of the insulator substrate and the thermal conductor.

3. The printed wiring board of claim 1, further comprising an electronic component attachment module positioned proximate to the targeted heat transfer region of the insulator substrate and the thermal conductor.

4. The printed wiring board of claim 1, further comprising a heat sink positioned proximate to the bulk region of the insulator substrate and the thermal conductor.

5. The printed wiring board of claim 1, wherein the targeted heat transfer region further comprises a composite structure having a plurality of thermally conductive rings that are embedded in the insulator substrate and encapsulate the second mounting region.

6. The printed wiring board of claim 1, wherein the targeted heat transfer region comprises a composite structure having a plurality of thermally conductive spokes that are embedded in the insulator substrate and spiraled around the second mounting region.

7. The printed wiring board of claim 1, wherein the targeted heat transfer region comprises a composite structure having a plurality of thermally conductive spokes that are embedded in the insulator substrate and radially arrayed around the second mounting region.

8. The printed wiring board of claim 1, wherein an effective thermal conductivity of the targeted heat transfer region is within about 10% of the effective thermal conductivity of the bulk region.

9. A circuit board assembly comprising:
a printed wiring board comprising an insulator substrate, an electrical conductor at least partially embedded within the insulator substrate, a second mounting region in electrical continuity with the electrical conductor, a first mounting region in electrical continuity with the electrical conductor, and a thermal conductor at least partially embedded within the insulator substrate and electrically isolated from the electrical conductor;
a second component coupled to the second mounting region; and
a first component coupled to the first mounting region,
wherein the insulator substrate and the thermal conductor are arranged into:
a targeted heat transfer region proximate to the second mounting region, wherein the targeted heat transfer region comprises an arrangement of the thermal conductor that completely surrounds the first component, and
a bulk region at positions spaced apart from the second mounting region, wherein the bulk region comprises a lattice arrangement of the thermal conductor in thermal continuity with the thermal conductor of the targeted heat transfer region.

10. The circuit board assembly of claim 9, wherein the electrical conductor is embedded within a first laminate and the thermal conductor is embedded within a second laminate, the first laminate and the second laminate coupled to one another in the printed wiring board.

11. The circuit board assembly of claim 9, wherein the thermal conductor is arranged in a targeted heat transfer region proximate to the second mounting region, the targeted heat transfer region comprising a composite structure having a plurality of thermally conductive rings that are embedded in the insulator substrate and encapsulate the first component mounting region.

12. The circuit board assembly of claim 9, wherein the thermal conductor is arranged in a targeted heat transfer region proximate to the second mounting region, the targeted heat transfer region comprising a composite structure having a plurality of thermally conductive spokes that are embedded in the insulator substrate and spiraled around the second mounting region.

13. The circuit board assembly of claim 9, wherein the thermal conductor is arranged in a targeted heat transfer region proximate to the second mounting region, the targeted heat transfer region comprising a composite structure having a plurality of thermally conductive spokes that are embedded in the insulator substrate and radially arrayed around the first component mounting region.

14. A heat transfer management apparatus comprising:
a printed wiring board comprising an insulator substrate, an electrical conductor at least partially embedded in the insulator substrate, and a thermal conductor at least partially embedded in the insulator substrate and electrically isolated from the electrical conductor;
a first component coupled to the printed wiring board;
a second component coupled to the printed wiring board and positioned distally from the first component,
wherein the printed wiring board places the first component and the second component in thermal continuity with one another, and the thermal conductor and the insulator substrate are arranged into:
a targeted heat transfer region proximate to the first component, wherein the targeted heat transfer region comprises an arrangement of the thermal conductor that completely surrounds the first component, and
a bulk region proximate to the second component, wherein the bulk region comprises a lattice arrangement of the thermal conductor in thermal continuity with the thermal conductor of the targeted heat transfer region.

15. The heat transfer management apparatus of claim 14, an effective thermal conductivity of the targeted heat transfer region is within about 10% of the effective thermal conductivity of the bulk region.

16. The heat transfer management apparatus of claim 14, wherein the first component comprises a thermo-electric generator.

\* \* \* \* \*